United States Patent [19]

Hodgson et al.

[11] Patent Number: 4,962,306

[45] Date of Patent: Oct. 9, 1990

[54] MAGNETICALLY FILTERED LOW LOSS SCANNING ELECTRON MICROSCOPY

[75] Inventors: Rodney T. Hodgson, Ossining; Francoise K. LeGoues, Peekskill; Oliver C. Wells, Yorktown Heights, all of N.Y.

[73] Assignee: Intenational Business Machines Corporation, Armonk, N.Y.

[21] Appl. No.: 444,926

[22] Filed: Dec. 4, 1989

[51] Int. Cl.$^5$ .......................................... H01J 37/244
[52] U.S. Cl. ................................. 250/310; 250/311; 250/305; 250/397; 250/306
[58] Field of Search ............... 250/310, 311, 306, 307, 250/397, 305

[56] References Cited

U.S. PATENT DOCUMENTS 3,717,761  2/1973  Hirotami Koike et al. ........ 250/310
3,924,126  12/1975  Anderson et al. .................. 250/311
4,179,604  12/1979  Christon ............................. 250/310
4,450,355  5/1984  Mariën et al. ....................... 250/310
4,633,085  12/1986  Tomita et al. ....................... 250/310
4,910,399  3/1990  Taira et al. ......................... 250/310

Primary Examiner—Jack I. Berman
Assistant Examiner—Kiet T. Nguyen
Attorney, Agent, or Firm—Jackson E. Stanland

[57] ABSTRACT

An electron microscope which includes a detector which is located in the magnetic field used to focus the primary electron beam onto the sample. The focusing magnetic field is used to energy-filter and/or energy analyze the scattered electrons without the need for additional equipment, such as a retarding-field energy filter. The magnetic field of the condenser-objective lens (or of any other type of magnetic lens) of the microscope provides the filtering and/or analyzing action, and the detector can be located so as to collect only low-loss electrons.

50 Claims, 4 Drawing Sheets

TRAJECTORY OF LLE

MAGNETICALLY FILTERED LOW LOSS SCANNING ELECTRON MICROSCOPY

DESCRIPTION

1. Field of the Invention

This invention relates to testing of samples using charged particles and in particular to electron microscopy, wherein the magnetic field used to focus the primary electron beam is also used to provide energy filtration and/or energy analyzation of the electrons scattered from the specimen to be examined.

2. Background Art

Inspection of very small features is critical to many industries and in particular to the microelectronics industry where semiconductor features and structures are to be examined. Charged particle testing can be nondestructive and is particularly suited to the inspection of structures having dimensions smaller than the wavelength of light. In order to inspect these structures, electron microscopes are often used. Such microscopes have been available since about 1930, and they are free from the optical light wavelength limitation of optical microscopes.

A scanning electron microscope (SEM) is known in the art for providing good resolution and depth of field. SEMs have been used to examine microcircuits and to expose patterns in resist layers as part of the fabrication process. In general, a finely focussed electron beam (primary beam) is directed onto a specimen or workpiece. An image is then formed (or information extracted without forming an image) from the signal that is obtained in some way as the specimen is scanned by the electron beam. Usually a certain percentage of electrons are scattered from the sample causing a backscattered electron signal (BSE). Some secondary electron emission can also be caused by the incidence of the primary beam.

In one technique for operation of the SEM the low-loss electrons (LLE) are collected. These low-loss electrons are typically those which have lost less than about 1% of the primary energy, as defined by O. C. Wells in Applied Physics Letters, Vol. 19, No. 7, page 232, Oct. 1, 1971. This reference describes the use of a spherical grid retarding-field energy filter to collect the backscattered electrons that have suffered only a small energy loss. Low-loss images from a solid sample have an information depth that is typically more shallow than 100Å (with a theoretical lower limit imposed by the mean free path between inelastic scattering events). These images show strong topographic and electron channeling contrasts.

Two versions of the scanning electron microscope are known. The first of these is a conventional SEM using an external focus final lens. In this type of instrument, the specimen is placed outside the magnetic field (focussing field) that focuses the electron beam onto the specimen. The second type of SEM is the so-called high resolution SEM in which improved resolution is obtained by mounting the specimen in the condenser-objective lens or other type of internal-focus lens. Improved spatial resolution results because of the lower aberrations of the condenser-objective lens. Thus in one mode of operation a solid specimen is mounted at an angle in the high-field region of the condenser-objective lens used to provide the focussing magnetic field. In this arrangement, electrons that are deflected by the second half of the focussing lens field into the exit lens bore are collected.

The following references describe features of the scanning electron microscope in order to provide a background for the present invention.

1. V. E. Cosslett etal, Electron Microscopy, Proceedings of the Stockholm Conference, Sept., 1956, page 12.
2. O. C. Wells etal, Appl. Phys. Lett. Vol. 23, No. 6, p. 353, Sept. 15, 1973.
3. O. C. Wells, Appl. Phys. Lett. 37 (6) p. 507, Sept. 15, 1980.
4. O. C. Wells, Appl. Phys. Lett. 49 (13), p. 764, Sept. 29, 1986.
5. O. C. Wells, Scanning, Vol. 10, p. 73–81 (1988)

As is clear from the foregoing references, low-loss electrons are used to provide clearer surface images of the specimen to be examined. However, the use of the retarding grids to stop all but the highest energy electrons from reaching the electron detector is not without problems. It is difficult to use this type of grid arrangement in the highest voltage SEMs because such high voltages on the screens of the retarding-field energy filter can cause arcing in the body of the SEM. Accordingly, it is an object of the present invention to provide a SEM in which low-loss electron imaging can occur in the presence of high voltages, where the voltages can be in excess of 55 kV.

As noted, resolution in the SEM can be improved by placing the sample in the high magnetic field region of the magnetic focussing lens. In these microscopes, it is also known that an image can be formed by placing an electron detector (scintillator) in the magnetic field close to the sample to intercept many of the scattered electrons without differentiating between the low-loss electrons and other scattered electrons which are constrained by the focussing magnetic field from reaching detectors that are placed too far from the beam axis. Reference 1 (Cosslett etal) above describes a microscope in which the detector is pushed into the polepiece gap of the microscope. Low-loss electron images can be formed when the sample is in the high magnetic field region by using a high angle of incidence onto the sample and by energy filtering the electrons scattered from the sample where the electrons are scattered through a small angle (less than 30°) to the impinging electron beam (reference 2). In the practice of the present invention, it is a further object to provide an apparatus and technique providing low-loss electron imaging of a sample immersed in a high magnetic filed region, where the angle of incidence of the primary beam and the scattering angle are not constrained.

It is also known in the art of electron optics that electrons travelling in a vacuum in a uniform magnetic field trace out spiral orbits where the radii of the orbits are proportional to velocity perpendicular to the magnetic field and inversely proportional to the magnetic field strength. If the velocity is perpendicular to the magnetic field, the orbits are circles. This fact has been used to select electrons with a specific energy loss in a transmission electron microscope as pointed out by Hillier etal, J. Appl. Physics, 15, 664, (1944). In this microscope, an additional uniform magnetic field is produced perpendicular to the electron beam axis at a point where the electrons exit from the sample. The electrons moving in the external magnetic field make approximately a half circle to a slit and a detector.

As pointed out by E. Munro, Electron Microscopy 1974: Eighth International Congress of Electron Microscopy, Camberra, Australia, Vol. 1, pp. 218-219 (1974), and discussed by O. C. Wells in reference 5 hereinabove, the second half of the focussing lens field will provide some energy filtering of the scattered electrons. However, such filtering is unlikely to be significant. In contrast with the teachings of these references, however, it is a further object of the present invention to use the magnetic field already present in the high field region of the magnetic lens of the microscope, which is essentially parallel to electron beam direction, to energy analyze the scattered electrons, in a different manner from the above.

It is a further object of this invention to use the focussing magnetic field already present in the microscope to effectively provide low-loss electron imaging of the specimen to be examined.

In the practice of the present invention, the scattered electrons will follow trajectories in the magnetic focussing field which can be calculated exactly if the magnetic field is known. Therefore, it is a further object of this invention to provide an apparatus and technique in which the number, energy, and scattering angles of electrons scattered from a specimen in an electron microscope can be inferred by recording the position of interception of the scattered electrons in a detector placed within the high magnetic field region of the magnetic focussing lens of the microscope.

It is a further object of this invention to provide an electron microscope in which a detector is placed in the magnetic field region of the microscope in a location such that the electrons scattered to it are those electrons having energies in the range between 100% and about 50% of the energy of the electrons in the primary electron beam.

It is another object of the present invention to provide a scanning electron microscope in which the specimen to be examined is preferably located in the high-field region of a condenser-objective lens, and wherein a detector is also located in the high-field region of the condenser-objective lens, the detector being precisely located to be responsive to only low-loss electrons.

It is a further object of this invention to apply the technique of the present invention to the energy analysis of positively or negatively charged particles such as electrons, ions, molecules, atoms, or protons.

It is another object of the present invention to provide a scanning electron microscope which does not require a retarding field energy filter for obtaining low-loss electron images, and further to provide a simplified scanning electron microscope wherein lower specimen tilt angles can be utilized together with higher beam energies when providing low-loss electron imaging.

It is a further object of this invention to provide scanning electron microscopy wherein conventional microscopes can be retrofitted to incorporate a detector into the specimen changing rod of the microscope, thereby allowing the ready placement of a detector in the high-field region of the microscope in a position wherein low-loss electron imaging can be achieved.

BRIEF SUMMARY OF THE INVENTION

In the practice of this invention, the specimen or sample to be analyzed is preferably mounted in the high-field region of a condenser-objective lens. The specimen can either be tilted or mounted at right angles to the primary electron beam. A detector is placed tangentially or radially just inside the surface of the region that can be reached by low-loss electrons in order to collect these electrons. Due to the focussing field, the low-loss electrons will be collected while the scattered electrons that have lost more than a certain energy will not reach the detector because they are confined within a smaller region by the focussing magnetic field. Ideally the surface of the detector should be curved to conform with the surface of the containment region defining the envelope of the paths followed by the low-loss electrons to be detected. Any form of detector can be used including a solid-state diode, a scintillator, a dynode, a channel plate or a current-collecting electrode. While the specimen is placed in the high-field region of the microscope in order to have high resolution, such placement is not necessary in the practice of the present invention. However, the placement of the specimen in the high-field region of the scanning electron microscope is a preferred embodiment. Another aspect of this preferred embodiment is that the location of the detector in the focussing magnetic field is such that it will detect low-loss electrons having energies within a defined range. In the preferred embodiment, the LLE have energies in the range between about 95% and 100% of the electrons in the primary beam. An outer limit to the energy range is to a minimum energy of about 50% of the energy in the primary beam. Still further, in this particular embodiment, the detector can be inserted into the high-field region of the microscope either through or between the polepieces of the condenser-objective lens.

In the apparatus and technique of this invention, an energy filter is provided having an arbitrarily small acceptance energy "window" and an arbitrarily large input acceptance solid angle that is not restricted by the focussing aberrations of the energy filtering system.

While a considerable portion of the specification illustrates the present invention in the context of a scanning electron microscope (SEM), the invention can be used in instruments generally referred to as scanning transmission electron microscopes (STEM), transmission electron microscopes (TEM) to which a scanning attachment has been added, or any instrument in which a finely focussed particle beam is scanned over a solid (or any other) specimen.

These and other objects, features, and advantages will be apparent from the following more particular description of the preferred embodiments.

BRIEF DESCRIPTION OF THE DRAWINGS

FIGS. 1A and 1B show the top view (along the direction of the primary electron beam) of the internal portion of a scanning electron microscope illustrating the energy filtering produced by the focussing magnetic field. Here FIG. 1A shows a placement of the detector that is at a right angle to the envelope of the scattered electron trajectories, while FIG. 1B shows showing a placement of the detector in a position that is tangent to the envelope of the scattered electron trajectories. FIG. 1C illustrates in more detail the paths taken by low-loss electrons in the high-field region of a condenser-objective lens, where the specimen is tilted so that low-loss electrons can be collected over a wide range of vertical angle. FIGS. 1D and 1E are two views from above in FIG. 1C, wherein FIG. 1D shows the limiting case when zero-loss electrons graze the center of the collector while FIG. 1E illustrates the general case when the collector is brought closer to the specimen.

DESCRIPTION OF THE PREFERRED EMBODIMENTS

Figure 1A:
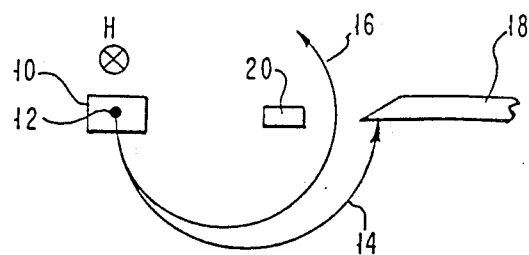
FIGS. 1A-1E illustrate various aspects of the principles of the present invention.
Figure 1B:
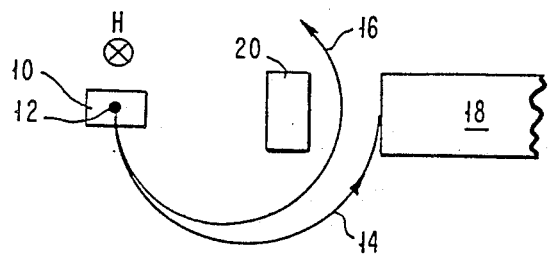
Figure 1C:
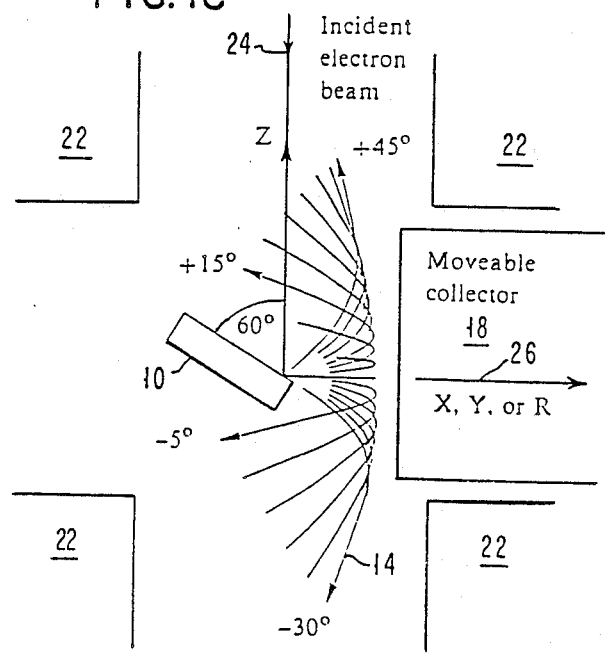
Figure 1D:
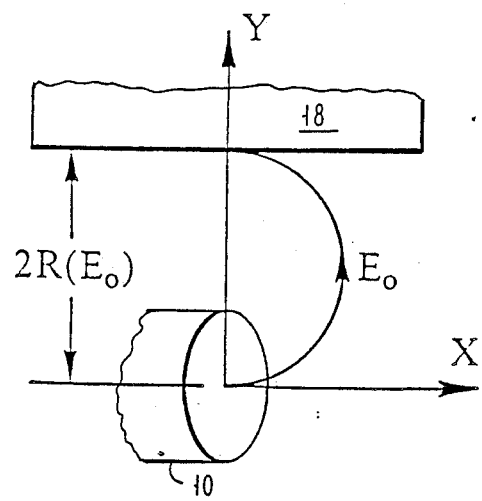
Figure 1E:
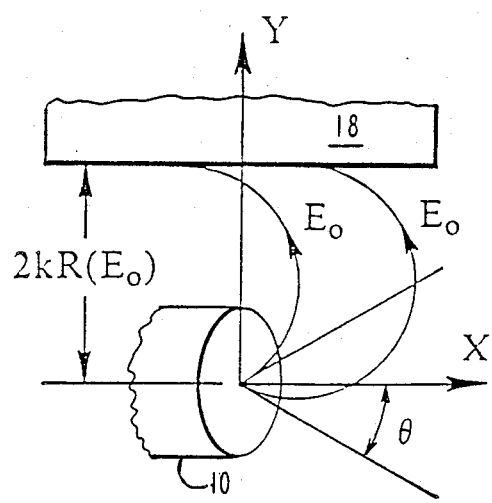

The basic idea of this invention is illustrated in FIGS. 1A and 1B, while FIGS. 1C-1E illustrate variations of the basic concept. In FIGS. 1A and 1B, the specimen or sample 10 is immersed in the magnetic field H of the condenser-objective lens. The primary electron beam (not shown) strikes sample 10 at location 12 and electrons are scattered from this location. Arrows 14 and 16 represent the trajectories of some of these scattered electrons moving in the magnetic field H. The electron orbit 14 represents the orbit followed by low-loss electrons (LLE) while orbit 16 is representative of the orbits followed by backscattered electrons (BSE) having lower energies. Because the trajectories followed by the BSE are more curved than those followed by the LLE, they will miss the radial detector 18 (FIG. 1A) or tangential detector 18 (FIG. 1B). In these two diagrams, an absorber 20 of x-rays is used to reduce background counts from detector 18 due to the generation of x-rays by the primary electron beam impinging on sample 10.

As will be more apparent with respect to FIG. 1C, the detector 18 can be mounted either just inside a surface determined by the trajectories of the LLE, or mounted on a positioning mechanism (as will be described in more detail with respect to FIGS. 6A and 6B) so that the position adjustment can be made while the apparatus is in operation. In this manner, energy filtering can be achieved. In the preferred embodiment, both the specimen 10 and the detector 18 are located in a high-field region of the microscope when the detector 18 is located such that only LLE are detected. More specifically, in this preferred embodiment, the energies of the detected LLE can be in the range between 100% and approximately 75% of the energies of the electrons in the primary beam. In FIGS. 1A and 1B, the specimen 10 is positioned nearly perpendicular or at an angle to the input electron beam (shown more precisely in FIG. 1C). For ease of illustration, the polepieces of the condenser-objective lens of the microscope are not shown in FIGS. 1A and 1B. These polepieces are shown in FIG. 1C.

FIG. 1C is an illustration of the apparatus whose general operation is shown in FIGS. 1A and 1B. For this reason the same reference numerals are used to indicate the same elements. In this FIGURE, the polepieces 22 of the focussing magnetic lens are shown, as is an arrow 24 representing the primary electron beam which strikes the specimen or sample 10. The low-loss electrons follow orbits, one of which is indicated by arrow 14, and can therefore strike the detector 18. The BSE having lower energies follow tighter orbits and are therefore not detected. In FIG. 1B, detector 18 is positioned so that the trajectories of LLE are essentially tangent to the collecting surface of the detector.

FIG. 1C illustrates the collection of LLE from the high-field region of a condenser-objective having polepieces 22 lens in which the specimen 10 is tilted so that LLE can be collected over a wide range of vertical angle. This figure illustrates more clearly the envelope defining the trajectories of the LLE and indicates how the collector (detector) 18 can be moved to a position just inside this envelope in order to detect only the LLE. The same reference numerals will be used to identify elements that are also present in FIGS. 1A and 1B.

The trajectories of these low-loss electrons scattered from the specimen have been calculated and plotted in R-Z Mode by E. Munro, cited above. As the primary electron beam voltage is raised, the focussing magnetic field must be increased to keep the focus at the same position on the sample. However, as long as the polepieces 22 of the condenser-objective lens do not saturate, the LLE trajectories 14 will not be changed in such a case, and the detector(s) 18 will not have to be adjusted in position as the accelerating voltage and the focussing magnetic field are adjusted. The surface of the containment region defined by the envelope of the trajectories 14 contains the points where these trajectories are furthest from the axis of the lens. The coordinate system is as follows: the z-axis lies along the axis of the microscope. The electron beam approaches the specimen in the negative z direction (arrow 24). The origin of coordinates is where this beam meets specimen 10. The y-axis is directed towards collector 18 so that the collecting surface (if it is flat and vertical as shown in FIG. 1C) lies in a plane with y=constant. Owing to the curvature of the electron trajectories, the LLE must leave the specimen nearly at right angles to the plane of the paper to reach a collector in the position shown in FIG. 1C. For this reason, the open arrow 26 denotes the x-axis for the specimen 10, the y-axis for the collector 18, and the R coordinat for the trajectories (see FIGS. 1D and 1E for the view from above).

FIG. 1C shows the situation when specimen 10 is not quite at the center of the magnetic focussing lens. The surface of the containment region is then not quite vertical at the mid-plane of this lens and curves inwards above and below that plane. Collector 18 is shown which almost completely fills the polepiece gap. This collector can collect LLE that leave the specimen at angles between about 45° above and about 30° below the xy plane. Ideally the detector 18 should be shaped so as to correspond to the envelope of the trajectories 14. In practice, it has been found that the method depicted in FIG. 1C works well if the specimen is tilted (as shown) by 30° from the horizontal. The motion of the detector 18 in FIGS. 1A, 1B, and 1C required to achieve an energy filtering effect can be either a simple motion to bring it in or out of the region that can be reached by the scattered electrons, or a motion to different parts of this surface, or a combination of these two. Alternatively, the effect of moving the detector 18 can be achieved by moving a knife-edge or other device (such as a device to scatter the electrons) in front of a fixed detector.

FIGS. 1D and 1E show the view from above with respect to FIG. 1C. In FIG. 1D, the limiting case is illustrated wherein the collector 18 is located such that zero-loss electrons scattered from the specimen 10 just graze the center of the collector. FIG. 1E illustrates the more general case when the collector 18 is brought closer to the specimen 10, in which case all of the low-loss electrons are collected. The dimensions shown and the energy $E_0$ will be described in more detail in the following paragraphs.

MATHEMATICAL ANALYSIS

As an approximation, the energy discrimination $s_{max}$ and the acceptance semi-angle $\theta_{coll}$ in the xy plane can be calculated on the assumption of a flat collector and a uniform magnetic field (FIGS. 1D, 1E). The electrons approach the speciment in the negative direction along the z axis at right angles to the paper plane. Suppose that the magnetic field is of uniform strength $B_z$ out of the paper. The surface of the specimen can be tilted relative to the plane of the diagram so the circular specimen is shown as an elipse. Suppose that an electron of energy $E=(1-s)E_0$ is scattered into the xy plane, where $E_0$ is the primary energy and s is the fractional energy loss in the specimen. The radius of curvature R(E) of the trajectory in the xy plane is:

$$R(E) = \frac{3.37}{B_z} \sqrt{E} \text{ [cm, eV, gauss]}. \tag{1}$$

FIG. 1D shows electrons scattered into the x direction with no loss of energy. These will just graze the center of the collector if it is as a distance of $2R(E_0)$ from the specimen.

In the more general case, the distance to the collector is $2kR(E_0)$ where k is less than unity (FIG. 1E). Electrons of energy greater than $(1-s)E_0$ can then reach the collector if the initial direction of emission from the specimen lies at an angle less than $\theta$ to the x direction, where s is given by:

$$s = 1 - \left[\frac{2k}{1+\cos\theta}\right]^2 \tag{2}$$

The slowest electrons to reach the collector leave the specimen in the x direction and graze the collector at the center point. The energy discrimination $s_{max}$ of the detector system is given by the value of s that corresponds to $\theta=0$ in eq. 2:

$$s_{max} = 1 - k^2 \tag{3}$$

The effective collector semi-angle $\theta_{coll}$ on either side of the x direction is defined by the value of $\theta$ for which s=0 in eq. 2:

$$\theta_{coll} = 2 \arccos \sqrt{k} \tag{4}$$

From Munro's data and if the specimen is at the midplane of the lens, then $R(E_0)=0.15D$, where D is the bore and spacing (assumed equal) of the lens. Thus, from the above equations and for a lens with D=1 cm, a movement of 15μm of the collector changes the energy discrimination by 1%. A delicate collector motion is therefore required.

For the LLE image, $s_{max}$ can be 0.1 while locating the field of view, and 0.01 or less while recording the image. With the retarding field energy filter that was used previously for LLE work, the semi-angle of the acceptance cone was 30°. According to Table 1, and with a filter resolution of 3%, the corresponding semi-angle is 20°. A considerably improved acceptance angle is expected if the surface of the collector can be curved to conform more closely with the surface of the containment region for the LLE in the lens.

The dependence of the energy discrimination $s_{max}$ on the specimen-to-collector distance limits the field of view at low magnification. Thus, if a 10 cm-square micrograph is recorded with a magnification of 1,000 diameters, then the field of view measures 100μm across. With the above size of lens, the energy discrimination will change by 100/15=6.7% across the field of view.

FIG. 2

Figure 2:
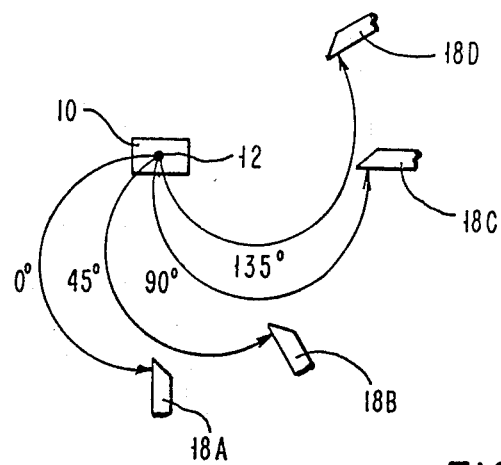
FIG. 2 illustrates the use of multiple detectors located in the magnetic field region of the condenser-objective lens in order to give different signals corresponding to, for example, different takeoff angles for electrons scattered from the specimen.

While FIGS. 1A-1E illustrated the use of a single detector, the present invention includes the use of multiple detectors as illustrated in FIG. 2. Again, the same reference numerals will be used to denote elements having the same function as those described previously. Thus, the specimen 10 is struck by the primary electron beam at location 12 and scatters electrons therefrom. These scattered electrons are detected by detectors 18A-18D in order to obtain different signals corresponding to (for example) different takeoff angles from the specimen. These multiple detectors can be obtained either by subdividing the active surface of a single detector, or by mounting separate units each of which is positioned to intercept the LLE leaving the surface at different polar (as shown in FIG. 2) or azimuthal angles or by moving a single detector so as to occupy successively the positions shown, or by any combination of these. Thus, LLE leaving with a takeoff angle of 0° are collected by collector 18A, while LLE scattered from specimen 10 at a takeoff angle of 135° are collected by detector 18D. This makes it possible (for example, using a a pair of detector located on opposing sides of a specimen) to apply (with this unique detector system) the well-known sum-or-difference technique to obtain increased information from the specimen. The detectors 18A-18D are located within the magnetic field of the focussing lens of the microscope.

Since the focussing magnetic field is used to provide energy differentiation between the LLE and the BSE, the practical limitation on voltage in present LLE imaging systems, caused by the possibility of arcing between the grids of the retarding field energy filter as noted previously, disappears. Thus, this invention allows the use of higher voltages (greater than 55 kV, and typically 200 kV or more) as accelerating voltages in LLE imaging. In turn, this allows better channeling contrast in crystals and higher resolution, as well as imaging of subsurface features buried below uniform films.

In many commercial models of SEM, STEM or TEM the specimen is introduced into the high-field region of a condenser-objective (or similar) lens using a specimen-insertion rod that comes in from the side. This allows the mounting of the detector on the same rod as the sample mount, as will be described with respect to FIGS. 6A and 6B. This feature allows retrofitting of conventional SEM's (and transmission electron microscopes with scanning attachments) so that the advantages of the present invention can be obtained.

An essential feature of this invention is the positioning of a detector having some sort of active surface such that the active surface lies just inside the region that can be reached by electrons scattered within a chosen energy range and chosen solid angle of emission from specimen 10. Detector design, whether fixed or adjustable in position, can take many variations. For example, the simplest detector system is a conducting electrode, either flat or curved, which is connected to an amplifier and current monitoring device. This conducting electrode can be inserted so that the electrons strike the conducting surface from the side (as shown in FIG. 1A for a knife edge) or substantially tangentially, as shown in FIG. 1B below, or at any arbitrary angle in between.

Detectors 18 may be solid-state diodes, either at ground potential or at any other potential. Typically, these diodes are made by fabricating a p-n junction (or any other form of electrically active junction) by any of many known techniques. The junction is located close to the surface of a silicon layer or other semiconductor material layer. The signal that is induced in this junction by the incoming scattered electrons is an indication of the properties of the specimen, as is well-known in SEM technology. The junction can be mounted either perpendicular to, tangential to, or at any angle relative to the trajectories of the LLE to achieve the collection purpose.

Figure 3:
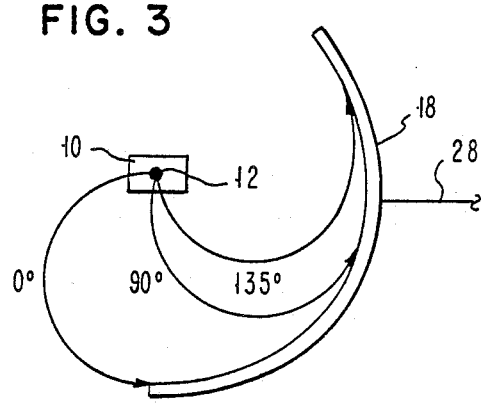
FIG. 3 illustrates the use of a curved detector which collects low-loss electrons scattered from the specimen at different locations along its length.

Although the detector devices described in the previous paragraph are generally manufactured with a flat surface, the present invention also relates to such detectors made with curved surfaces as shown in FIG. 3. In this embodiment, the detector 18 has a curved surface to more closely conform with the surface of the region that is accessible to the scattered electrons. Thus, the curved surface detector 18 can detect scattered electrons having, for example takeoff angles of 0°-135°.

Detector 18 in FIG. 3 is, for example, a conducting curved electrode to which an amplifier and current monitoring device can be connected by the wire conductor 28. As an alternative, the detector may by a phosphor or scintillator material on a light pipe (or its equivalent) which is coupled to a photodetector.

Semiconductor diode arrays such as charge coupled device (CCD) arrays may be inserted in the position shown in FIG. 1A, or at another angle such that the LLE strike the surface of the array at a more glancing angle. The output of the CCD array could be sent to a video monitor for display thereon, including analysis by a computer to measure the signal from the LLE. When the field of view of the SEM is large compared to the diode array spacing, the position of the LLE interception will change as the position of the electron beam on the sample changes. With computer control of the direction and rate of the rastor scan of the primary electron beam on the sample, and of the readout of the CCD array, this apparent motion is accounted for. The CCD array can measure the distribution of charge landing on a surface and, if coupled to a computing system, can be used to process the information derived from the array. In this manner, the same information is obtained as could be obtained from a detector or knife-edge.

As noted, detectors may be made of either phosphor or scintillator material which can be flat or curved as well as being metallized or unmetallized. These detectors can be coupled to a photodetector for the purpose of detecting electrons as described above. Any of these detector designs may be operated at a positive or negative potential so as to modify the energy with which the scattered electrons enter the detector. For example, a positive bias may be applied to permit operation with a lower primary beam energy.

Figure 4:
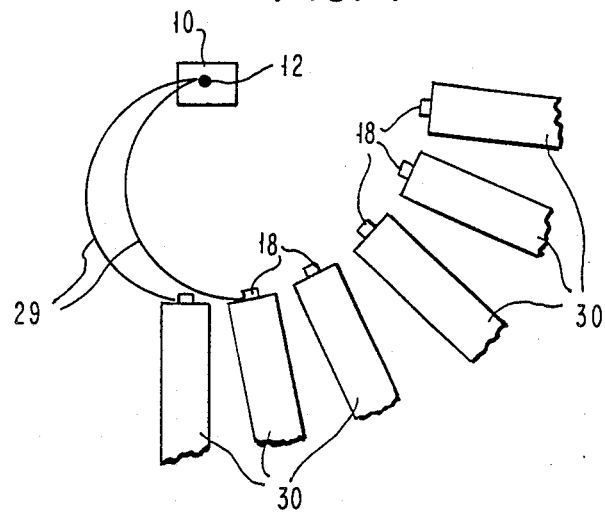
FIG. 4 illustrates the use of a plurality of detectors spaced withi the magnetic field region of the condenser-objective lens, but wherein each detector is located in contact with an optical fiber or light pipe.

If the detector surface is curved to a shape determined by the envelope of the trajectories of the LLE, the LLE will enter the surface of the detector at an angle nearly tangential to that surface. The collection efficiency of light from scintillator detectors can be improved by placing the scintillator detectors over the centers of optical fibers or light pipes as illustrated in FIG. 4. In this drawing, the electrons scattered from specimen 10 follow orbits 29 to the scintillator detectors 18, each of which is located on the center of an optical fiber or light pipe 30.

Figure 5:
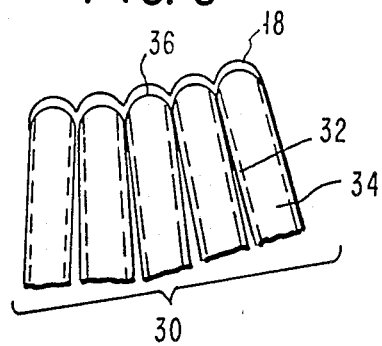
FIG. 5 shows a variation of the detector structure of FIG. 4 wherein the fiber optic array has been etched so that the more slowly etched cores of the fibers project above the faster etched cladding of the fibers, the entire surface of the array being covered with scintillator material.

FIG. 5 shows a variation of the detector arrangement of FIG. 4, which is a more easily manufactured version. In this diagram, the detectors 18 are a continuous layer of scintillator material deposited on curved surfaces of light fibers 30. These light fibers each have an inner transmitting portion 32 and a cladding portion 34 used to provide total internal reflection of light in the fibers 30. When these fibers are etched in a suitable etchant, the cores 32 etch at a slower rate than does the cladding material 34. This leaves curved surface regions 36 on which the scintillator material 18 is deposited.

A detector design of the type shown in FIG. 5 is easily manufactured and provides very efficient coupling of light produced by the scintillator layer 18 into the fiber optic array. This array of light fibers may be arranged to collect the LLE over a large acceptance angle, depending upon the size of the fiber optic array.

Any of these detector designs may be operated with the addition of a wired mesh, either in contact with the input surface of the detector or separated from it, and with the mesh and the detector biased to whatever potential may be advantageous. As an example, the mesh can be held at ground potential so as to avoid any disturbance to the motion of the electrons between the specimen and the mesh while the detector that is behind the mesh can be held at a positive potential so as to accelerate the electrons up to a speed at which the detector is more sensitive, and so to allow the use of a lower incident electron beam energy.

The mesh may have a fine spacing so that the incoming electrons strike the wires of the mesh to give rise to scattered electrons that can be detected. As an alternative, the mesh can have an open weave so that, for example, a positive potential applied to the detector can penetrate through the mesh openings and in this way set up an interface beyond the surface of the mesh which acts as the effective surface of the collector. In the practice of this invention, the degree to which such an attracting field penetrates through the openings of the mesh can be controlled so as to achieve the same effect as that which would be achieved by physically moving the detector. This effective "positioning" of the detector by the attractive field can be accomplished using a mesh having any degree of openings ranging from very fine to open weave meshes.

The detector described hereinabove may be replaced by a hole or a plurality of holes in a metal or non-metal plate or plates or by a knife-edge positioned together with a detector as described below so as to achieve an energy-filtering action by the magnetic field of the focussing lens. These holes may be placed either side by side so that an electron may pass through only one hole, or one after the other so that an electron can pass through more than one hole in sequence. A combination of these two arrangements may also be used. The electrons that pass through this hole or holes in the plate or plates may be detected by a current amplifier, scintillator, or a solid-state diode or any other form of detector known in the art including detectors that are sensitive to the spin of the particle being detected. These detectors can be placed on the exit side of the hole or holes. Alternatively, the electrons may be deflected, accelerated, decelerated, directed onto a dynode, or sorted according to particle spin or treated in any way whatsoever after passing through the hole or holes before being detected in any of the ways above described.

In FIG. 1C, the specimen or sample was shown mounted close to the center of the magnetic field distribution in the manner of the well-known condenser-objective lens. However, the present invention applies equally well to any type of lens in which the BSE and LLE enter the focussing field above the specimen, whether the specimen is fully immersed, partly immersed, or totally screened from the magnetic field of the lens.

While FIG. 1C shows the detector located between the planes of the upper and lower polepieces of the magnetic lens, the detector need not be located in this position. The principles of this invention apply equally well to detectors that extend either upwards or downwards into (or are placed entirely within) the lens bores.

Figure 6A:
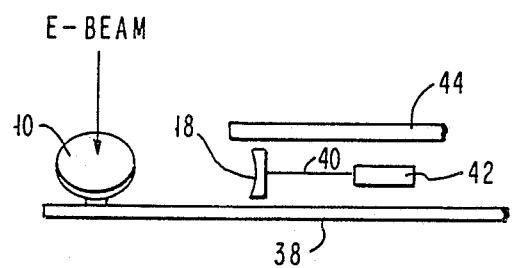
FIGS. 6A and 6B show a side view and top view, respectively, of a specimen holding apparatus having the detector attached thereto for insertion into the magnetic field of the condenser-objective lens of a microscope.
Figure 6B:
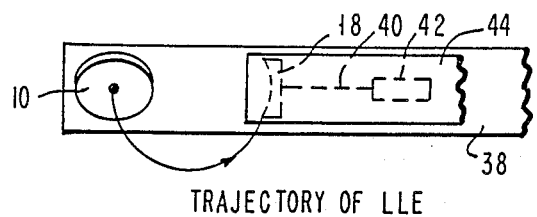

FIGS. 6A and 6B illustrate side and top views of a holder which accommodates both the specimen to be analyzed and the detector. This embodiment also applies to any side-entry specimen insertion rod used with a condenser-objective (or similar) lens. The same reference numerals will be used for the sample 10 and detector 18 as were used in the previous drawings. Thus, in the side view of FIG. 6A, a rod 38 is used to support both specimen 10 and detector 18. Connected to detector is a current conductor 40 which couples the output of the detector 18 to the associated electronics 42. Or alternatively any of the detectors described above could be used.

An x-ray stop can be placed between 10 and 18.

A shield 44 is located over the top surface of detector 18.

As noted previously, as the electron beam voltage is raised the magnetic field must be increased to keep the focus at the same position on the sample. As long as the polepieces do not saturate, the LLE trajectories will not be changed in such a case and the detector position will not have to be adjusted relative to the lens axis as the accelerating voltage and the focussing magnetic field are adjusted. However, it is customary in specimen insertion rods of this type to move the specimen in the microscope by moving the entire rod, so a mechanism can be provided to adjust the position of the detector in any direction relative to the rod. This allows easy retrofitting of a LLE detector to conventional SEM's and to TEMs with a scanning attachment.

EXAMPLES

The invention was evaluated using the upper specimen stage of an ISI Model 130S SEM. The transmission detector was removed from its usual position below the upper stage and was modified for the experiment. It was remounted on a side-port level with the upper stage. The mechanism by which the transmission detector can be withdrawn from the beam was fitted with a micrometer for accurate motion. The transmission scintillator was removed and the light pipe was extended to bring it closer to the axis of the microscope. Ideally, the light pipe should be brought in through the port that is at right angles to the specimen rod, but this was occupied by the energy dispersive x-ray detector. The new detector was therefore brought in through a port at 45° to the specimen rod, and the end of the light pipe was cut at 45° so that the scintillating surface was in a vertical plane parallel to the specimen rod. Any one of the three detectors on the left side of the column could be moved into position close to the specimen.

In the unmodified upper stage specimen holder, the specimen motions occur in the same plane as the upper surface of the specimen stub. This is good for taking secondary electron (SE) or backscattered electron (BSE) images using the detectors that are supplied with the microscope, but it makes it impossible for LLE that leave the specimen in a direction below that plane to reach the detector. A spare specimen insertion assembly was bought and the locating rod on the outside was moved through 90°. The surface of the specimen stub became vertical while the specimen motions were still in the horizontal plane. The half-space on the left of the specimen rod axis was therefore unobstructed for the escape of LLE. A specimen stub was made with the specimen on the stub axis but facing sideways. The stub axis is now horizontal so the tilt of the specimen can be changed by rotating the stub in the holder. For LLE imaging the specimen is tilted away from the operator by ~30°. The LLE are then deflected to the scintillator on the left by the lens field. (If the magnetic field in the lens were to be reversed, then the specimen would be tilted *towards* the operator.) This does not affect the SE images that are essential when using the LLE method, but it may affect the collection efficiency of the BSE detector that is supplied with the microscope.

During the initial trial of the method, the end of the light pipe was covered with a layer of plastic scintillator from a solution in xylene, and then aluminised. This method words well for an electron energy of 10 keV, but was a failure with the 40 keV electrons used here because the layer was too thin. A greatly improved signal was obtained from an aluminised yttrium aluminum garnet (YAG) single crystal scintillator disk of diameter 1.0 cm and thickness 0.1 cm. Ideally the photomultiplier should be replaced to match the emission lines of the YAG scintillator, but this was not done.

The operation of the new detector was verified using a copper mesh as a specimen. In this model of SEM, the condenser-objective lens is not activated at magnifications below ~300 diameters, so that at low magnifications a low-resolution image is obtained by focusing the beam with the preceding condenser lens. In the SE image the sample appears to be illuminated from the direction of viewing. In this mode of operation, the BSE are not deflected by the lens field, and a signal is obtained from the new detector regardless of the distance of the scintillator from the specimen. As is to be expected, this gives an image that is illuminated from the direction of the scintillator.

When the condenser-objective lens is activated, the resolution of both images is greatly improved. The LLE signal is only obtained if the scintillator is at less than the required distance from the specimen. The effective direction of the illumination has changed through a right angle as is to be expected from the deflection of the LLE by the lens field. This gives a typical LLE image from a rough sample with strong shadowing owing to the limited solid angle of the detector and with satisfactory imaging of the surface only from the parts of the specimen surface that are oriented correctly relative to the detector.

This detector is now being used for studies of GaAs. A comparison pair of LLE and SE images from GaInAs grown on GaAs was made. The SE image shows a dark region surrounding a particle on the GaInAs surface, but this does not appear in the LLE image. It is believed that this is a thin surface layer that affects the work-function but not the LLE signal. Small dots of this material are seen over the surface. The LLE image is noisier than the SE image but shows stronger topographic contrasts that agree in general appearance with Nomarski images.

A comparison pair at higher magnification was also made. The field of view was identified by a dust particle at the center. Once again, the SE image showed small regions where the SE emission is reduced while the LLE showed stronger topographic contrasts. In some cases the LLE images showed fine lines that change with the channeling condition in a similar way to the dislocation images described by Morin etal, Phil. Mag. A,40,511 (1979).

The present invention provides a new technique and apparatus for use in electron microscopes, and in particular utilizes a LLE detector arrangement that is smaller in size than previous units and which can be operated with a higher beam energy. The invention allows a less steeply tilted specimen to be used because it is no longer necessary to put an energy filter below the polepieces of the focussing lens.

As always, the LLE image is noisier than the scattered electron image for the same beam current. The idea is to obtain different image contrasts with a shallower information depth. Previous work had shown that with either the BSE or the LLE image and with a fixed angle of incidence, the strengths of topographic and electron channeling contrast depend on the takeoff angle of the detector. Thus in general, with a high takeoff angle relative to the tangential plane, topographic contrast is weak (or even zero), while channeling contrast may remain strong. This suggests that it would be useful to divide the detector shown in FIG. 1C into sections between different z planes, each of which would collect the LLE from a different takeoff angle from the specimen. In this way the takeoff angle could be optimized for a particular problem.

In the practice of this invention it is possible to incorporate a detector (for example, using a solid-state diode and associated knife-edge and x-ray stop) into the specimen changing rod of any transmission electron microscope that is fitted with a scanning attachment. In this manner it is possible to obtain high voltage LLE images with very simple equipment. In turn this will be advantageous for the study of crystal defects using channeling contrast with high beam energies by the methods described by P. Morin etal. Phil. Mag. A, 40, 511 (1979) and P. Morin etal, Scanning, 2, 217 (1979). A low voltage version of this microscope can also be built by accelerating the LLE onto a scintillator after selecting the energy (for example using a mesh or knife edge) in accordance with the principles of the present invention.

While the invention has been described with respect to particular embodiments thereof, it will be apparent to those of skill in the art that variations may be made therein without departing from the spirit and scope of the present invention.

We claim:

1. An electron apparatus including, in combination:
   means for producing an electron beam,
   means for directing said beam to a sample to be examined,
   means for producing a magnetic field in which said sample is immersed, and
   a detector for detecting electrons scattered from said sample, said detector being located in said magnetic field at a location such that only low-loss electrons scattered from said sample reach said detector.

2. The apparatus of claim 1, where said low-loss electrons have an energy within 5% of the energy of electrons in said beam.

3. The apparatus of claim 2, where said microscope is a scanning electron microscope.

4. The apparatus of claim 1, where said means for producing a magnetic field is a condenser-objective lens.

5. The apparatus of claim 1, where said sample is located in a high-field region of said magnetic lens.

6. The apparatus of claim 5, where said detector is located in a high-field region of said magnetic lens.

7. The apparatus of claim 1, further including scanning means for scanning said electron beam across said sample.

8. The apparatus of claim 1, where said detector has a curved electron collecting surface substantially matching the envelope of the trajectories of said low-loss electrons in said magnetic field.

9. The apparatus of claim 1, including a plurality of detectors arranged in position substantially along the envelope of the trajectories of said low-loss electrons in said magnetic field.

10. The apparatus of claim 1, where said sample and said detector are attached to a single holder.

11. The apparatus of claim 10, further including means for moving said detector relative to said holder.

12. The apparatus of claim 1, including a plurality of detectors having curved surfaces, the curved surfaces being substantially in a shape determined by the envelope of the trajectories of the scattered low-loss electrons.

13. The apparatus of claim 1, where said low-loss electrons scattered from said sample have energies within about 1% of the energies of electrons in said beam.

14. In an electron microscope having a sample to be examined located within a focussing magnetic field and means for scanning an electron beam across said sample, the improvement comprising a detector for collecting low-loss electrons scattered from said sample, said detector being located at a position in said magnetic field intercepted only by the trajectories of scattered low-loss electrons.

15. An apparatus, including:
   means for producing a beam of charged particles, means for directing said beam of charged particles to a sample to be examined, means for producing a focussing electromagnetic field in which said sample is immersed, and a detector for detecting charged particles scattered from said sample, said detector being located in a position in said electromagnetic field such that the envelope of the trajectories of charged particles, scattered from said sample with essentially the same energy as the charged particles incident upon said sample are tangent to a surface of said detector.

16. The apparatus of claim 15, where said detector has a curved surface for collecting said scattered charged particles, said curved surface having a shape corresponding to the envelope of the trajectories of charged particles scattered from said sample with essentially the same energies as the energies of the charged particles incident upon said sample.

17. The apparatus of claim 15, including a plurality of detectors being located so that the charged particle collecting surfaces of said detectors are substantially tangential to said trajectories.

18. The apparatus of claim 15, where said detector is comprised of a scintillator material, said scintillator material being adjacent to a light guide for conducting light produced by charged particles striking said scintillator material.

19. The apparatus of claim 15, where said detector is a semiconductor detector.

20. The apparatus of claim 15, including a plurality of detectors for collecting said charged particles scattered from said sample, said detectors being comprised of scintillator detectors connected to light pipes.

21. The apparatus of claim 15, where said detector is comprised of a scintillator material coated on an optical fiber.

22. The apparatus of claim 21, where the center of said optical fiber protrudes beyond a surface determined by said envelope of trajectories, the edges of said optical fiber being outside said envelope of trajectories.

23. A method for analyzing a sample with a beam of charged particles, including the following steps:

immersing a sample in an electromagnetic field, producing a beam of charged particles, directing said beam to said sample, collecting charged particles having a first energy range or scattering angle which are scattered from said sample to a detector located at a first position in said electromagnetic field, the trajectories of said scattered charged particles being determined by their energies after striking said sample and by said electromagnetic field, and moving said detector to a second location in said electromagnetic field to collect charged particles scattered from said sample at a second energy range or scattering angle.

24. The method of claim 23, where said charged particles are electrons and said electromagnetic field is a magnetic field.

25. The method of claim 24, where said sample is located in a high-field region of said magnetic field.

26. The method of claim 23, where said detector is moved in said electromagnetic field, the positions of said detector being determined by the scattering angles of charged particles scattered from said sample.

27. An apparatus for examining a sample, including:

means for producing a beam of charged particles, means for directing said beam to a sample, field means for producing a field for focussing said beam of charged particles, the trajectories in said field of charged particles scattered from said sample being determined by the energies of said scattered charged particles and by said field, and detector means located in said field at a position where the charged particles striking said detector after scattering from said sample are those which have essentially the same energy as charged particles in said beam.

28. The apparatus of claim 27, where said detector has a flat conducting surface placed tangentially to the envelope of the trajectories of said scattered charged particles, said conducting surface being connected to a current measuring device.

29. The apparatus of claim 27, where said detector has a conducting surface curved substantially in a shape determined by the envelope of the trajectories of said scattered charged particles.

30. The apparatus of claim 27, where said detector is a semiconductor detector.

31. The apparatus of claim 30, where the surface of said semiconductor detector is curved substantially in a shape determined by the envelope of the trajectories of said scattered charged particles.

32. The apparatus of claim 27, where said detector is comprised of a scintillator material, the surface of said scintillator material being substantially tangent to the envelope of the trajectories of said scattered charged particles, said scintillator surface being connected to a light measuring device.

33. The apparatus of claim 32, where said scintillator is connected to a light pipe which conducts light from the scintillator to a photodetector.

34. The apparatus of claim 27, where said detector is a scintillator detector having a curved surface, said surface being curved to a shape determined by the envelope of the trajectories of said scattered charged particles.

35. The apparatus of claim 27, where said detector is located at a position such that its collecting surface is substantially tangent to the trajectories of charged particles scattered from said sample with essentially the same energy as the charged particles in said beam.

36. The apparatus of claim 27, where said detector is a scintillator located over the center of an optical fiber, the end of said optical fiber being positioned substantially on a surface determined by the envelope of the trajectories of said scattered charge particles.

37. The apparatus of claim 27, including a plurality of detectors formed by a scintillator material coated on an array of optical fibers.

38. The apparatus of claim 37, where said fibers have a central portion which protrudes beyond a surface determined by the envelope of the trajectories of said scattered charged particles, said trajectories being substantially tangent to said surface.

39. The apparatus of claim 27, where said detector has a conducting surface placed at an angle to the trajectories of said scattered charged particles.

40. The apparatus of claim 39, where said conducting surface has an edge curved substantially in a shape matching the envelope of the trajectories of said scattered charged particles, the envelope of said trajectories being substantially tangent to the curved edge of said detector.

41. The apparatus of claim 27, where said beam of charged particles is a beam of electrons.

42. The apparatus of claim 40, where the means for producing a beam of charged particles is a scanning electron microscope.

43. The apparatus of claim 40, where said means for producing a beam of charged particles is a scanning transmission electron microscope (STEM).

44. The apparatus of claim 40, where said means for producing a beam of charged particles is a transmission electron microscope (TEM).

45. The apparatus of claim 40, where said means for producing a beam of charged particles is a scanning tunneling microscope (STM).

46. The apparatus of claim 39, where said means for producing a beam of charged particles is an atomic force microscope (AFM).

47. The apparatus of claim 1, where said low-loss electrons have minimum energies at least about 50% of the energy of the electrons in said beam.

48. The apparatus of claim 14, where said scattered low-loss electrons have energies greater than about 50% of the energies of electrons in said electron beam that is scanned across said sample.

49. The apparatus of claim 15, where the minimum energy of charged particles scattered from said sample is about 50% of the energy of charged particles in said beam of charged particles.

50. The apparatus of claim 27, where the minimum energy of charged particles scattered from said sample is about 50% of the energy of charged particles in said beam of charged particles.

* * * * *